US008422190B2

(12) United States Patent
Ito et al.

(10) Patent No.: US 8,422,190 B2
(45) Date of Patent: *Apr. 16, 2013

(54) COMPOSITE ELECTRONIC DEVICE, MANUFACTURING METHOD THEREOF, AND CONNECTION STRUCTURE OF COMPOSITE ELECTRONIC DEVICE

(75) Inventors: Tomokazu Ito, Tokyo (JP); Yasuhiro Hirobe, Tokyo (JP); Atsushi Hitomi, Tokyo (JP); Yuji Terada, Tokyo (JP); Kensaku Asakura, Tokyo (JP); Takeshi Urano, Tokyo (JP)

(73) Assignee: TDK Corporation, Tokyo (JP)

( * ) Notice: Subject to any disclaimer, the term of this patent is extended or adjusted under 35 U.S.C. 154(b) by 854 days.

This patent is subject to a terminal disclaimer.

(21) Appl. No.: 12/568,911

(22) Filed: Sep. 29, 2009

(65) Prior Publication Data

US 2011/0007438 A1    Jan. 13, 2011

(30) Foreign Application Priority Data

| Sep. 30, 2008 | (JP) | 2008-254540 |
| Sep. 30, 2008 | (JP) | 2008-254541 |
| Sep. 30, 2008 | (JP) | 2008-254542 |
| Jan. 21, 2009 | (JP) | 2009-011174 |
| Jan. 21, 2009 | (JP) | 2009-011175 |
| Jan. 21, 2009 | (JP) | 2009-011176 |

(51) Int. Cl.
*H02H 1/04* (2006.01)

(52) U.S. Cl.
USPC ........................................................ 361/119

(58) Field of Classification Search ............... 361/119
See application file for complete search history.

(56) References Cited

U.S. PATENT DOCUMENTS

| 4,031,498 | A | * | 6/1977 | Hayashi et al. ................. 338/21 |
| 4,977,357 | A |   | 12/1990 | Shrier |
| 7,692,527 | B2 | * | 4/2010 | Ito et al. ........................ 336/200 |
| 7,728,695 | B2 | * | 6/2010 | Sato .............................. 333/185 |
| 8,199,451 | B2 | * | 6/2012 | Asakura et al. ............... 361/112 |
| 8,243,406 | B2 | * | 8/2012 | Asakura et al. ................. 361/56 |
| 2003/0045041 | A1 |  | 3/2003 | Katoh et al. |

(Continued)

FOREIGN PATENT DOCUMENTS

| JO | H08-203737 A | 8/1996 |
| JP | 08-250309 | 9/1996 |

(Continued)

OTHER PUBLICATIONS

Office Action of Dec. 27, 2011 in related KR application No. 2009-092538 and translation of relevant portion thereof.

(Continued)

*Primary Examiner* — Ronald W Leja
(74) *Attorney, Agent, or Firm* — Young Law Firm, P.C.

(57) ABSTRACT

The present invention is provided with a composite electronic device comprising an inductor element and an ESD protection element formed between two magnetic substrates, wherein the inductor element includes insulation layers made of a resin, and conductor patterns formed on the insulation layers, the ESD protection element includes a base insulation layer, a pair of electrodes arranged via gap formed therebetween on the base insulation layer, and an ESD absorbing layer arranged at least between the electrodes, and the ESD absorbing layer includes a composite material having an insulation inorganic material and a conductive inorganic material discontinuously dispersed in a matrix of the insulation inorganic material.

19 Claims, 14 Drawing Sheets

U.S. PATENT DOCUMENTS

| | | | |
|---|---|---|---|
| 2006/0049894 A1* | 3/2006 | Tomonari et al. | 333/181 |
| 2006/0097835 A1* | 5/2006 | Tomonari et al. | 336/200 |
| 2008/0079533 A1 | 4/2008 | Liu et al. | |
| 2008/0129439 A1 | 6/2008 | Nishikawa et al. | |
| 2008/0290977 A1* | 11/2008 | Ito et al. | 336/184 |
| 2008/0303621 A1* | 12/2008 | Ito et al. | 336/200 |
| 2009/0021337 A1* | 1/2009 | Sato | 336/234 |
| 2009/0154052 A1* | 6/2009 | Yoneda et al. | 361/220 |
| 2010/0157501 A1* | 6/2010 | Asakura et al. | 361/112 |
| 2010/0270588 A1* | 10/2010 | Kosowsky et al. | 257/183 |

FOREIGN PATENT DOCUMENTS

| | | |
|---|---|---|
| JP | 2755752 | 3/1998 |
| JP | 2002-329872 | 11/2002 |
| JP | 2003-70229 | 3/2003 |
| JP | 2003-123936 | 4/2003 |
| JP | 2005-44952 | 2/2005 |
| JP | 2006-294724 | 10/2006 |
| JP | 2007-195060 | 8/2007 |
| JP | 2007-214166 | 8/2007 |
| JP | 2007-265713 A | 10/2007 |
| JP | 2008-28214 | 2/2008 |
| JP | 2008-85284 | 4/2008 |
| JP | 2008-140858 | 6/2008 |

OTHER PUBLICATIONS

JP Office Action of Aug. 31, 2010 in related JP Appln No. 2009-011174 and translation of relevant portion thereof.

JP Office Action of Aug. 3, 2010 in related JP Appln No. 2009-011175 and translation of relevant portion thereof.

JP Office Action of Aug. 3, 2010 in related JP aplication No. 2009-011176 and translation of relevant portion thereof.

JP Office Action of Nov. 30, 2010 in related JP Appln. No. 2009-011175 and Trenstation of relevant portion thereof.

JP Office Action of Nov. 30, 2010 in related JP Appln. No. 2009-011176 and Trenstation of relevant portion thereof.

JP Office Action of Jan. 8, 2013 for JP Appl. No. 2011-097434.

* cited by examiner

-- PRIOR ART --

-- PRIOR ART --

COMPOSITE ELECTRONIC DEVICE, MANUFACTURING METHOD THEREOF, AND CONNECTION STRUCTURE OF COMPOSITE ELECTRONIC DEVICE

TECHNICAL FIELD

The present invention relates to a composite electronic device and a manufacturing method thereof, and, more particularly relates to a structure of a composite electronic device constituted by combining inductor elements and electrostatic discharge (ESD) protection elements. The present invention also relates to a structure of connection between such a composite electronic device and signal lines.

BACKGROUND OF THE INVENTION

In recent years, standards of USB 2.0 and a high-definition multimedia interface (HDMI) have been widely distributed as high-speed signal transmission interfaces, and they are used in many digital devices such as personal computers and digital high-vision televisions. These interfaces employ a differential signal system that transmits a differential signal (a differential mode signal) by using a pair of signal lines, unlike a single-end transmission system that has been generally used for many years.

The differential transmission system has excellent characteristics in that the system is not easily affected by exogenous noise as well as that the system has a small radiation electromagnetic field generated from the signal lines, as compared with the single-end transmission system. Therefore, a signal can have small amplitude, and the system can perform a higher-speed signal transmission than the single-end transmission system, by shortening a rise time and a fall time based on the small amplitude.

FIG. 13 is a circuit diagram of a general differential transmission circuit.

The differential transmission circuit shown in FIG. 13 includes a pair of signal lines 1 and 2, an output buffer 3 that supplies a differential mode signal to the signal lines 1 and 2, and an input buffer 4 that receives a differential mode signal from the signal lines 1 and 2. In this configuration, an input signal IN given to the output buffer 3 is transmitted to the input buffer 4 via the pair of signal lines 1 and 2, and is reproduced as an output signal OUT. This differential transmission circuit has a characteristic that a radiation electromagnetic field generated from the signal lines 1 and 2 is small, as described above. However, this circuit generates a relatively large radiation electromagnetic field when common noise (common mode noise) is superimposed on the signal lines 1 and 2. To decrease the radiation electromagnetic field generated by the common mode noise, it is effective to insert a common-mode choke coil 5 into the signal lines 1 and 2, as shown in FIG. 13.

The common-mode choke coil 5 has characteristics that impedance to a differential component (a differential mode signal) transmitted through the signal lines 1 and 2 is low and that impedance to an in-phase component (common mode noise) is high. Therefore, by inserting the common-mode choke coil 5 into the signal lines 1 and 2, common mode noise transmitted through the pair of signal lines 1 and 2 can be interrupted without substantially attenuating the differential mode signal.

In a latest high-speed digital interface such as an HDMI, an IC very sensitive to static electricity is used because the interface handles a fine signal of a high transmission rate. Accordingly, ESD (electrostatic discharge) becomes a large problem. To prevent destruction of the IC due to ESD, a varistor is used as an ESD countermeasure device between the signal lines and a base. However, when the varistor is used, a signal waveform becomes inert, and signal quality is degraded. Therefore, a lower-capacitance ESD countermeasure device is required. For example, as shown in FIG. 14, Japanese Patent Application Laid-open No. 2008-28214 proposes an ESD protection circuit having an electrostatic capacitance of an ESD protection device 9 set to 0.3 pF or lower, by connecting a coil 8 in series on signal lines 7 connected to an IC 6 and by connecting the ESD protection device 9 between each signal line 7 and the ground (see FIG. 8 of Japanese Patent Application Laid-open No. 2008-28214).

Japanese Patent Application Laid-open No. 2007-214166 discloses a structure having a voltage-dependency resistance material having an ESD protection function provided on an uppermost part of a composite electronic device accommodating a common-mode noise filter and the ESD protection function in one package. According to this structure, the voltage-dependency resistance material can be provided after sintering a laminated body containing many insulation layers. With this arrangement, it is possible to prevent reduction of the ESD protection function due to oxidation and cracking of the voltage-dependency resistance material at a sintering time. Consequently, the ESD protection function can be improved.

However, according to the common mode filter described in Japanese Patent Application Laid-open No. 2007-214166, the voltage-dependency resistance material constituting ESD protection elements contains a resin. Therefore, the ESD protection elements need to be provided on the uppermost part due to a constraint of a manufacturing step which becomes a large constraint on design. The voltage-dependency resistance material is filled into a very fine gap of about 10 μm. At the uppermost part, an uneven area is large in a plane surface due to a structure that many insulation layers formed with conductor patterns are laminated. Consequently, it is considerably difficult to stably form a very fine gap. Further, in forming the ESD protection elements on a top layer, the manufacturing step becomes complex, and manufacturing cost increases.

SUMMARY OF THE INVENTION

Therefore, it is an object of the present invention to provide a compact and high-performance composite electronic device constituted by combining a common mode filter and ESD protection elements having a small electrostatic capacitance and excellent discharge characteristic, heat resistance, and weatherability. Another object of the present invention is to provide a manufacturing method of manufacturing such a composite electronic device in high quality. Still another object of the present invention is to provide a connection structure of such a composite electronic device and signal lines.

To solve the problems described above, the composite electronic device according to the present invention comprises an inductor element and an ESD protection element formed between two magnetic substrates, wherein the inductor element includes insulation layers made of a resin, and conductor patterns formed on the insulation layers, the ESD protection element includes a base insulation layer, a pair of electrodes arranged via gap formed therebetween on the base insulation layer, and an ESD absorbing layer arranged at least between the electrodes, and the ESD absorbing layer includes a composite material having an insulation inorganic material and a conductive inorganic material discontinuously dispersed in a matrix of the insulation inorganic material.

According to the present invention, the composite electronic device includes low-voltage discharge type ESD protection elements having a very small electrostatic capacitance, a low discharge starting voltage, and excellent discharge resistance. Therefore, the composite electronic device can transmit a signal equivalent to a signal having no ESD countermeasure, and can suppress reduction of characteristic impedance. Further, because a composite of a conductive inorganic material and an insulation inorganic material is configured as an ESD protection material, pressure resistance can be remarkably increased, and weatherability in external environments such as temperature and humidity can be remarkably increased. Because the inductor elements and the ESD protection elements are formed in one chip, a very compact and high-performance electronic device can be provided.

In the present specification, "composite" means a state that a conductive inorganic material is dispersed in a matrix of an insulation inorganic material. This is a concept including not only a state that a conductive inorganic material is dispersed uniformly or at random in a matrix of an insulation inorganic material but also a state that an aggregate of a conductive inorganic material is dispersed in a matrix of an insulation inorganic material, that is, a state generally called a sea-island structure. In the present specification, "insulation" means resistance that is equal to or higher than 0.1 Ωcm, and "conductivity" means resistance that is lower than 0.1 Ωcm. So-called "semiconductivity" is included in the former so long as specific resistance thereof is equal to or higher than 0.1 Ωcm.

In the present invention, the inductor element preferably includes first and second spiral conductors formed on a plane surface perpendicular to a layer-laminating direction, and the first and second spiral conductors constitute a common mode filter and are magnetically coupled with each other. According to this constitution, common mode noise can be removed while preventing ESD. Therefore, the inductor elements can be preferably used to remove noise of a high-speed digital signal line requiring an ESD countermeasure.

In the present invention, an electrostatic capacitance of the ESD protection element has a value preferably equal to or lower than 0.35 pF. When the electrostatic capacitance of the ESD protection element is 0.35 pF or less, a differential-transmission impedance standard (100±15Ω) of a high-speed differential transmission line of a DVI (digital visual interface) and an HDMI can be satisfied. Therefore, destruction of an IC due to ESD can be securely prevented without giving practical influence to a signal quality.

In the present invention, a material of the resin is one of the polyimide resin and an epoxy resin. An insulation inorganic material is preferably at least one kind selected from a group of $Al_2O_3$, $TiO_2$, $SiO_2$, ZnO, $In_2O_3$, NiO, CoO, $SnO_2$, $V_2O_5$, CuO, MgO, $ZrO_2$, AlN, BN, and SiC. Because these metal oxides are excellent in insulation, heat resistance, and weatherability, these metal oxides function effectively as materials constituting an insulation matrix of a composite. As a result, it is possible to realize highly-functional ESD protection elements having excellent discharge characteristic, heat resistance, and weatherability. Because these metal oxides are obtainable at a low cost and because a sputtering method can be applied to these metal oxides, productivity and economics can be increased.

In the present invention, a conductive inorganic material is preferably at least one kind of metal or a metal compound of these metals selected from a group of C, Ni, Cu, Au, Ti, Cr, Ag, Pd, and Pt. By compounding these metals or a metal compound in a state of a discontinuous dispersion in a matrix of an insulation inorganic material, highly-functional ESD protection elements having excellent discharge characteristic, heat resistance, and weatherability can be realized.

In the present invention, an ESD absorbing layer is preferably a composite formed by sequentially sputtering an insulation inorganic material and a conductive inorganic material, or a composite formed by simultaneously sputtering an insulation inorganic material and a conductive inorganic material. By this arrangement, a composite containing a conductive inorganic material in a state of a discontinuous dispersion in a matrix of an insulation inorganic material can be easily obtained in good reproducibility.

In the present invention, the pair of electrodes is preferably formed on a surface of one of the magnetic substrates via the base insulation layer. According to this configuration, because mutually oppositely-arranged electrodes are formed on a magnetic substrate of satisfactory flatness, gaps between the electrodes can be stably formed.

In the present invention, the gap provided between the pair of electrodes are arranged not to be overlapped with conductor patterns of the inductor element viewed from the layer-laminating direction. According to this configuration, center portions of ESD protection elements are provided at positions deviated from the conductor patterns. Therefore, influence to upper and lower layers can be suppressed when the ESD protection elements are partially destroyed by ESD, and a composite electronic device having higher reliability can be realized.

A composite electronic device according to the present invention comprises a common-mode filter layer and an ESD protection layer provided between two magnetic substrates, wherein the common-mode filter layer includes first and second insulation layers made of a resin, a first spiral conductor formed on the first insulation layer, and a second spiral conductor formed on the second insulation layer, the ESD protection layer includes a first ESD protection element connected to one end of the first spiral conductor, and a second ESD protection element connected to one end of the second spiral conductor, the first and second spiral conductors are formed in a plane-surface direction perpendicular to a laminating direction, and are arranged to be magnetically coupled to each other, each of the first and second ESD protection elements includes a pair of electrodes arranged via gap formed therebetween on the base insulation layer, and ESD absorbing layer arranged at least between the electrodes, and the ESD absorbing layer includes a composite material having an insulation inorganic material and a conductive inorganic material discontinuously dispersed in a matrix of the insulation inorganic material.

The composite electronic device according to the present invention further includes a third ESD protection element connected to the other end of the first spiral conductor, and a fourth ESD protection element connected to the other end of the second spiral conductor. The third and fourth ESD protection elements have the same configurations as those of the first and second ESD protection elements. According to this configuration, because the ESD protection elements are connected to both of a pair of input ends and a pair of output ends of the composite electronic device, the composite electronic device can be mounted without requiring consciousness of a direction of connection to a pair of signal lines. Consequently, handling at a manufacturing time can be facilitated.

Furthermore, the objects of the present invention can also be achieved by a connection structure of a pair of signal lines and a composite electronic device having a first ESD protection element connected to one end of a first spiral conductor and having a second ESD protection element connected to one end of a second spiral conductor, and by a connection structure of the composite electronic device having one end of the first spiral conductor and one end of the second spiral conductor connected to an input side of the pair of signal lines. When one ends of the first and second spiral conductors are connected to the input side of the signal lines, the first and second ESD protection elements are provided in a pre-stage of the first and second spiral conductors. Signals reflected from the first and second spiral conductors are considered to be superimposed with an input waveform and absorbed by the ESD protection elements in higher voltages. Therefore, ESD can be securely absorbed.

Further, the method of manufacturing a composite electronic device according to the present invention includes a step of forming an ESD protection layer on a surface of a first magnetic substrate, a step of forming a common-mode filter layer on a surface of an ESD protection layer, and a step of forming a second magnetic substrate on a surface of a common-mode filter layer. The step of forming the ESD protection layer includes a step of forming a base insulation layer on a surface of the first magnetic substrate, a step of forming a pair of electrodes arranged via gap formed therebetween on a surface of the base insulation layer, and a step of forming an ESD absorbing layer arranged at least between the electrodes. The ESD absorbing layer includes a composite material having an insulation inorganic material and a conductive inorganic material discontinuously dispersed in a matrix of the insulation inorganic material.

According to the present invention, ESD protection elements having a very small electrostatic capacitance can be formed. Therefore, a signal equivalent to a signal having no ESD countermeasure can be transmitted, and reduction of characteristic impedance can be suppressed. A very compact and highly-functional electronic device having inductor elements and ESD protection elements formed in one chip can be manufactured. According to the present invention, mutually oppositely-arranged electrodes can be formed on a magnetic substrate of satisfactory flatness, and gaps between the electrodes can be stably formed.

In the present invention, the step of forming a common-mode filter layer includes a step of alternately forming insulation layers made of a resin and conductor patterns. Insulation layers, conductor patterns, a base insulation layer, and electrodes are preferably formed by a thin-film forming method. According to this arrangement, because the ESD protection layer and the common-mode filter layer are consistently formed by the thin-film forming method, a composite electronic device can be manufactured without via a specific manufacturing step.

As described above, according to the present invention, it is possible to provide a compact and high-performance composite electronic device constituted by combining a common mode filter and ESD protection elements having a small electrostatic capacitance and excellent discharge characteristic, heat resistance, and weatherability. Particularly, the composite electronic device according to the present invention has a significant effect in a high-speed signal interface such as a high-speed HDMI having a large signal-transmission amount and a very high transmission speed. Further, according to the present invention, it is possible to provide a connection structure with signal lines capable of causing the composite electronic device to function effectively.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will be explained below in detail with reference to the accompanying drawings.

Figure 1:
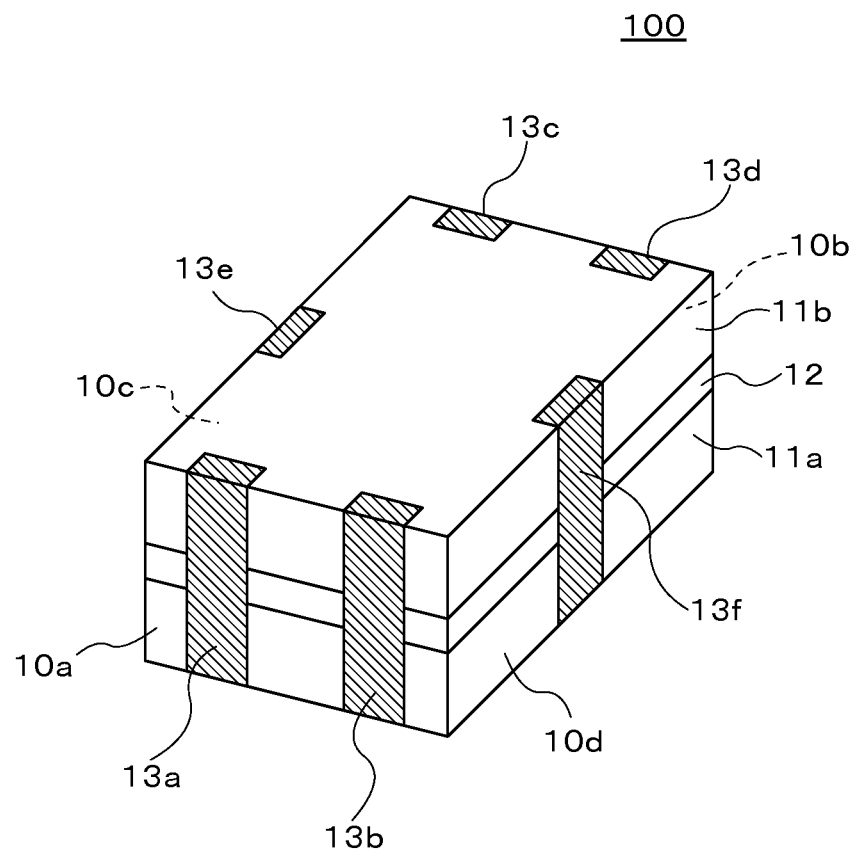
FIG. 1 is a schematic perspective view showing an external configuration of a composite electronic device according to a first embodiment of the present invention.

FIG. 1 is a schematic perspective view showing an external configuration of a composite electronic device according to a first embodiment of the present invention.

As shown in FIG. 1, a composite electronic device 100 according to the first embodiment is a thin-film common mode filter having an ESD protection function, and includes first and second magnetic substrates 11a and 11b, and a function layer 12 sandwiched between the first magnetic substrate 11a and the second magnetic substrate 11b. First to sixth terminal electrodes 13a to 13f are formed on an external peripheral circuit of a laminated body constituted by the first magnetic substrate 11a, the function layer 12, and the second magnetic substrate 11b. The first and second terminal electrodes 13a and 13b are formed on a first side surface 10a. The third and fourth terminal electrodes 13c and 13d are formed on a second side surface 10b opposite to the first side surface 10a. The fifth terminal electrode 13e is formed on a third side surface 10c orthogonal with the first and second side surfaces 10a and 10b. The sixth terminal electrode 13f is formed on a fourth side surface 10d opposite to the third side surface.

The first and second magnetic substrates 11a and 11b physically protect the function layer 12, and serve as a closed magnetic path of the common mode filter. Sintered ferrite, composite ferrite (a resin containing powdery ferrite), and the like can be used as materials of the first and second magnetic substrates 11a and 11b. The first and second magnetic substrates 11a and 11b of the present embodiment may have a single layer structure or a multilayer structure.

Figure 2:
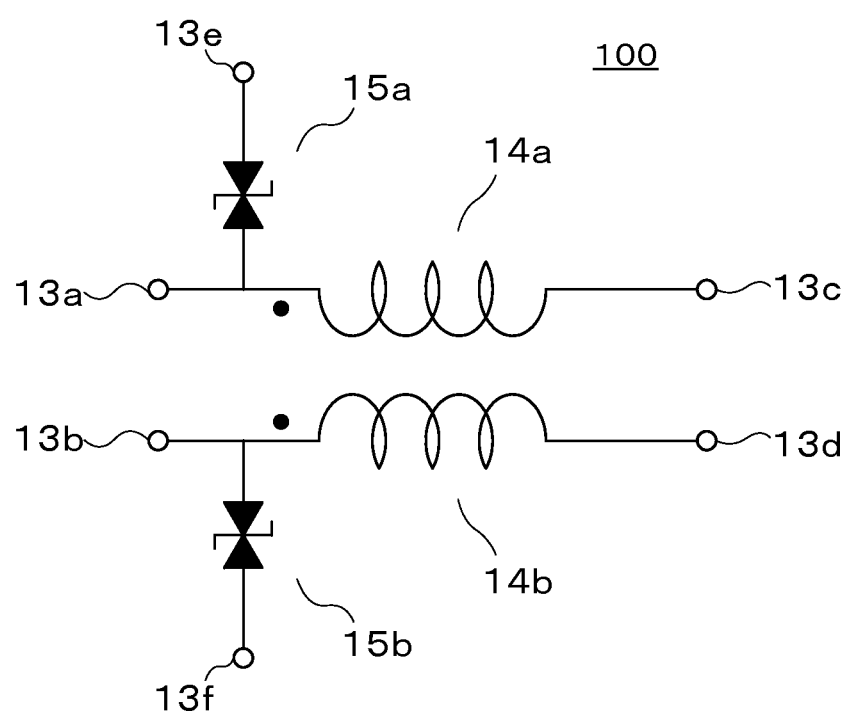
FIG. 2 is a circuit diagram showing a configuration of the composite electronic device 100.

FIG. 2 is a circuit diagram showing a configuration of the composite electronic device 100.

Figure 13:
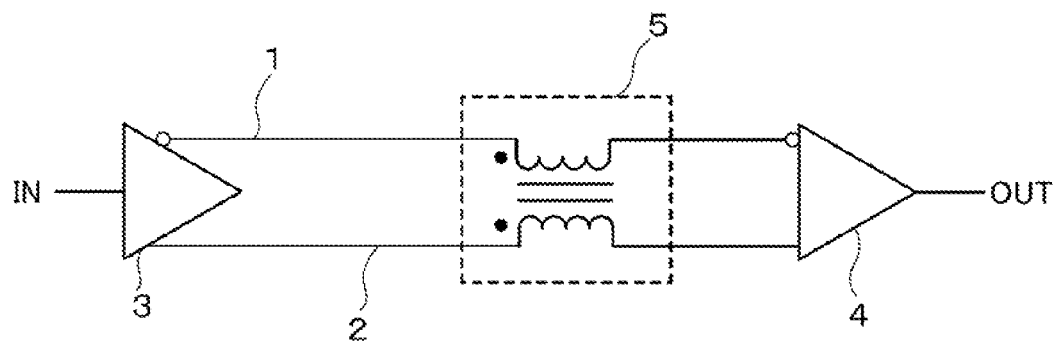
FIG. 13 is a circuit diagram of a general differential transmission circuit.
Figure 14:
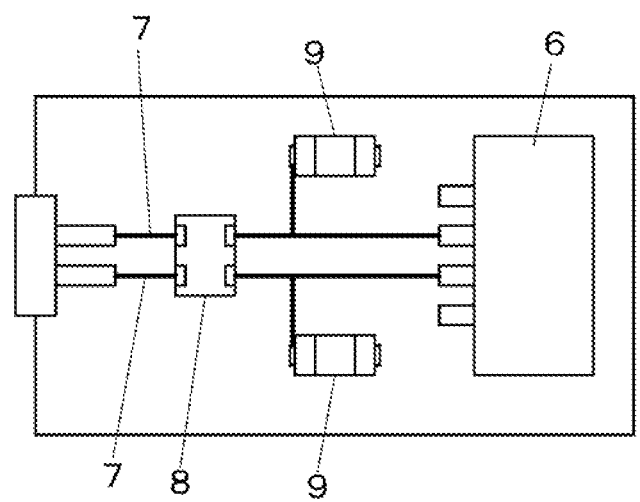
FIG. 14 is a circuit diagram showing a conventional ESD countermeasure circuit.

As shown in FIG. 2, the composite electronic device 100 includes inductor elements 14a and 14b functioning as a common-mode choke coil, and ESD protection elements 15a and 15b. One ends of the inductor elements 14a and 14b are connected to the first and second terminal electrodes 13a and 13b, respectively, and the other ends of the inductor elements 14a and 14b are connected to the third and fourth terminal electrodes 13c and 13d, respectively. One ends of the ESD protection elements 15a and 15b are connected to the first and second terminal electrodes 13a and 13b, respectively, and the other ends of the ESD protection elements 15a and 15b are connected to the fifth and sixth terminal electrodes 13e and 13f, respectively. As shown in FIG. 13, the composite electronic device 100 is mounted on a pair of signal lines. In this case, the first and second terminal electrodes 13a and 13b are connected to the input side of the signal lines, and the third and fourth terminal electrodes 13c and 13d are connected to an output side of the signal lines. The fifth and sixth terminal electrodes 13e and 13f are connected to a base line.

Figure 3:
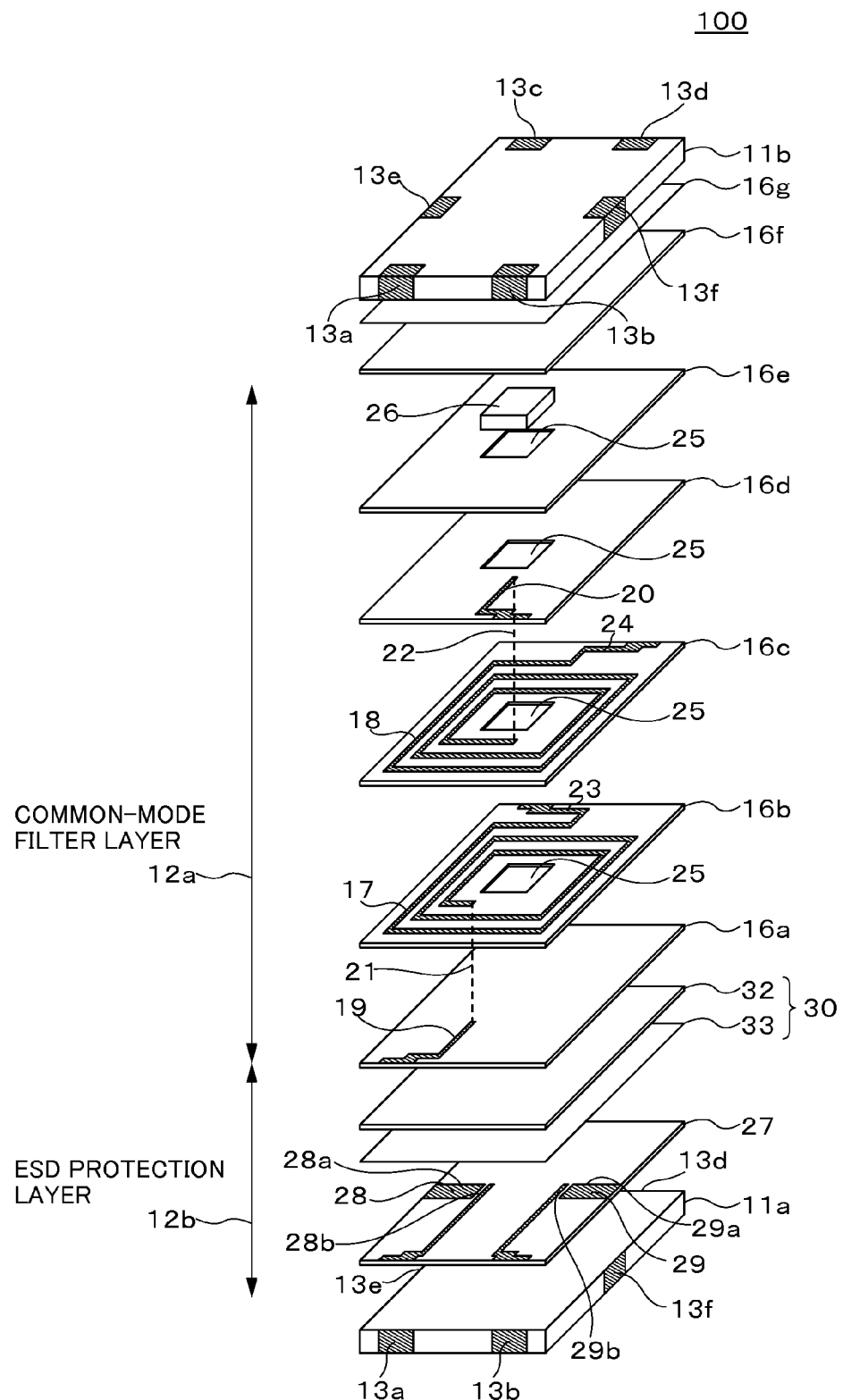
FIG. 3 is a schematic exploded perspective view showing one example of a layer structure of the composite electronic device 100.

FIG. 3 is a schematic exploded perspective view showing one example of a layer structure of the composite electronic device 100.

As shown in FIG. 3, the composite electronic device 100 includes the first and second magnetic substrates 11a and 11b, and the function layer 12 sandwiched between the first and second magnetic substrates 11a and 11b. The function layer 12 is constituted by a common-mode filter layer 12a and an ESD protection layer 12b.

The common-mode filter layer 12a includes insulation layers 16a to 16e, a magnetic layer 16f, an adhesive layer 16g, a first spiral conductor 17 formed on the insulation layer 16b, a second spiral conductor 18 formed on the insulation layer 16c, a first lead conductor 19 formed on the insulation layer 16a, and a second lead conductor 20 formed on the insulation layer 16d.

The insulation layers 16a to 16e insulate between conductor patterns, or conductor patterns and the magnetic layer 16f, and function to secure the flatness of a base surface on which the conductor patterns are formed. For materials of the insulation layers 16a to 16e, it is preferable to use a resin excellent in electric and magnetic insulation and having a good workability. Preferably, a polyimide resin and an epoxy resin are used. Preferably, Cu, Al and the like excellent in conductivity and workability are used for conductor patterns. The conductor patterns can be formed by an etching method and an additive method (plating) using photolithography.

An opening 25 piercing through the insulation layers 16b to 16e is provided at an interior portion of the first and second spiral conductors 17 and 18 as center regions of the insulation layers 16b to 16e. A magnetic substance 26 to form a closed path is filled into between the first magnetic substrate 11a and the second magnetic substrate 11b, within the opening 25. A composite ferrite and the like are preferably used for the magnetic substance 26.

The magnetic layer 16f is formed on a surface of the insulation layer 16e. The magnetic substance 26 within the opening 25 is formed by curing a paste of composite ferrite (a resin containing a magnetic powder). At a curing time, the resin is contracted, and unevenness occurs at an opening portion. To decrease this unevenness, it is preferable to coat the paste on a whole surface of the insulation layer 16e as well as the interior portion of the opening 25. The magnetic layer 16f is formed to secure this flatness.

The adhesive layer 16g is a layer necessary to bond the magnetic substrate 11b onto the magnetic layer 16f. The adhesive layer 16g also functions to suppress the unevenness of the surfaces of the magnetic substrate 11b and the magnetic layer 16f, and increasing close adhesiveness. While not particularly limited, an epoxy resin, a polyimide resin, and a polyamide resin can be used as materials of the adhesive layer 16g.

The first spiral conductor 17 corresponds to the inductor element 14a shown in FIG. 2. An internal peripheral end of the first spiral conductor 17 is connected to the first terminal electrode 13a via a first contact hole conductor 21 and the first lead conductor 19 piercing through the insulation layer 16b. An external peripheral end of the first spiral conductor 17 is connected to the third terminal electrode 13c via a third lead conductor 23.

The second spiral conductor 18 corresponds to the inductor element 14b shown in FIG. 2. An internal peripheral end of the second spiral conductor 18 is connected to the second terminal electrode 13b via a second contact-hole conductor 22 and the second lead conductor 20 piercing through the insulation layer 16d. An external peripheral end of the second spiral conductor 18 is connected to the fourth terminal electrode 13d via a fourth lead conductor 24.

The first and second spiral conductors 17 and 18 have the same plane surface shape, and are provided at the same position as a planar view. The first and second spiral conductors 17 and 18 are completely overlapped with each other, and therefore, a strong magnetic coupling occurs between the first and second spiral conductors 17 and 18. Based on the above configuration, conductor patterns within the common-mode filter layer 12a constitute a common mode filter.

The ESD protection layer 12b includes a base insulation layer 27, first and second gap electrodes 28 and 29 formed on a surface of the base insulation layer 27, and an ESD absorbing layer 30 covering the first and second gap electrodes 28 and 29. A layer structure near the first gap electrode 28 is a portion functioning as the first ESD protection element 15a shown in FIG. 2, and a layer structure near the second gap electrode 29 is a portion functioning as the second ESD protection element 15b. One end of the first gap electrode 28 is connected to the first terminal electrode 13a, and the other end of the first gap electrode 28 is connected to the fifth terminal electrode 13e. One end of the second gap electrode 29 is connected to the second terminal electrode 13b, and the other end of the second gap electrode 29 is connected to the sixth terminal electrode 13f.

Figure 4:
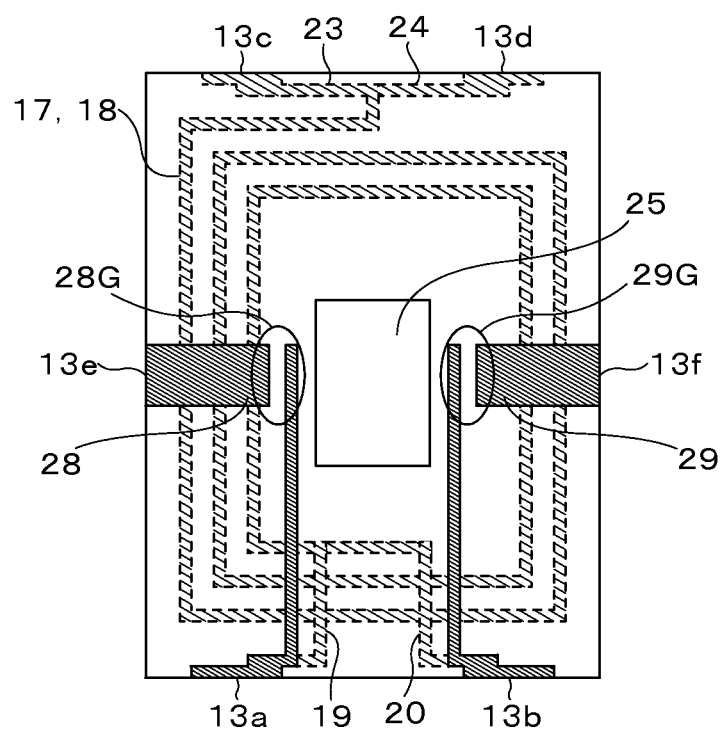
FIG. 4 is a schematic plan view showing a positional relationship between the gap electrodes 28 and 29 and other conductor patterns.

FIG. 4 is a schematic plan view showing a positional relationship between the gap electrodes 28 and 29 and other conductor patterns.

As shown in FIG. 4, gaps 28G and 29G held by the gap electrodes 28 and 29, are provided at positions not overlapped on the plane with the first and second spiral conductors 17 and 18 and the first and second lead conductors 19 and 20 constituting the common mode filter. Although not particularly limited, in the first embodiment, the gaps 28G and 29G are provided in an open region between the spiral conductors 17 and 18 and the opening 25 at the inside of the spiral conductors 17 and 18. While details thereof are described later, because ESD protection elements are partially damaged or deformed due to absorption of ESD, conductor patterns have a risk of being damaged at the same time when the conductor patterns are arranged at a position overlapped with the ESD protection elements. However, because the gaps 28G and 29G of the ESD protection elements are provided at positions deviated from the conductive patterns, influence to upper and lower layers can be suppressed when the ESD protection elements are partially destroyed by ESD, and a composite electronic device having higher reliability can be realized.

Figure 5A:
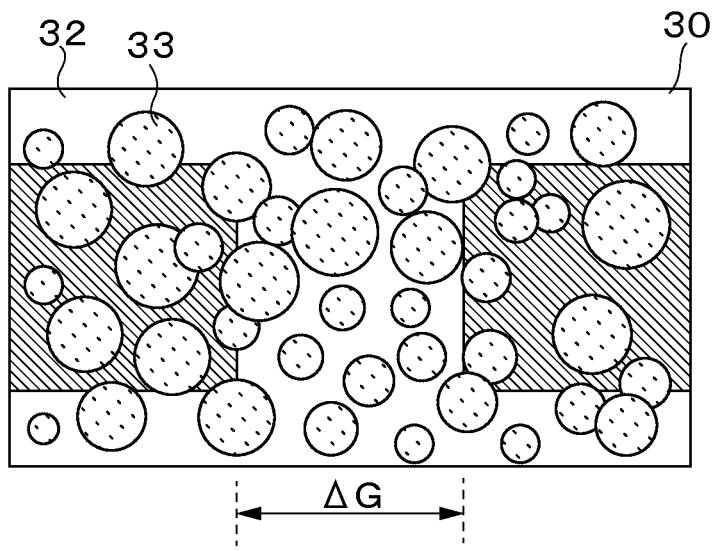
FIG. 5A is a schematic plan view showing one example of a layer structure near the first gap electrode 28 in the ESD protection layer 12b.
Figure 5B:
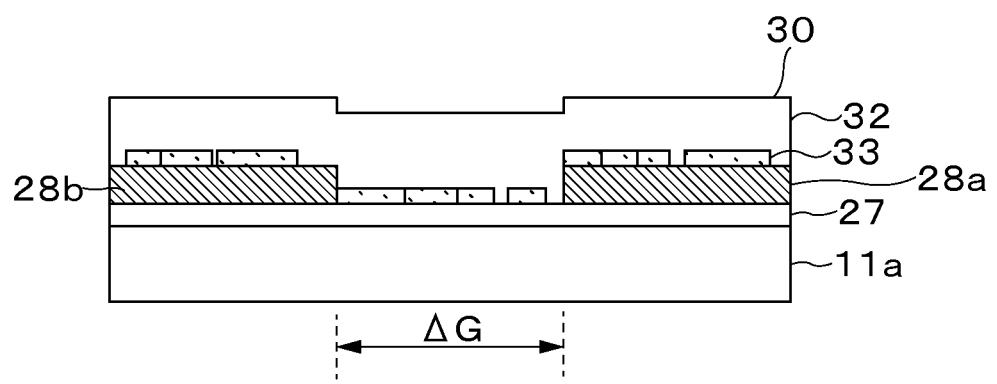
FIG. 5B is a schematic cross-sectional view showing one example of a layer structure near the first gap electrode 28 in the ESD protection layer 12b.

FIGS. 5A and 5B are examples of a layer structure near the first gap electrode 28 in the ESD protection layer 12b, where FIG. 5A is a schematic plan view and FIG. 5B is a schematic cross-sectional view. A configuration of the second gap electrode 29 is the same as that of the first gap electrode 28, and therefore redundant explanations will be omitted.

The ESD protection layer 12b includes the base insulation layer 27 formed on a surface of the magnetic substrate 11a, a pair of the electrodes 28a and 28b constituting the first gap electrode 28, and the ESD absorbing layer 30 arranged between the electrodes 28a and 28b. In this ESD protection layer 12b, the ESD absorbing layer 30 functions as a low-voltage discharge type ESD protection material. The ESD absorbing layer 30 is designed to secure initial discharge between the electrodes 28a and 28b via the ESD absorbing layer 30 when an excess voltage of ESD is applied.

The base insulation layer 27 is made of an insulation material. In the first embodiment, the base insulation layer 27 covers a whole surface of the magnetic substrate 11a from easiness of manufacturing. However, the base insulation layer 27 does not need to cover the whole surface when the base insulation layer 27 is at least a base of the electrodes 28a and 28b and the ESD absorbing layer 30.

As a detailed example of the base insulation layer 27, there can be suitably used a substance obtained by forming an insulation film made of a low-dielectric-constant material having a dielectric constant equal to or lower than 50, preferably equal to or lower than 20, of NiZn ferrite, aluminum, silica, magnesia, and aluminum nitride, on the surface of the first magnetic substrate 11a. A method of forming the base insulation layer 27 is not particularly limited, and a known method can be applied such as a vacuum deposition method, a reactive deposition method, a sputtering method, an ion plating method, and a gas phase method such as CVD and PVD. A film thickness of the base insulation layer 27 can be suitably set.

A pair of the electrodes 28a and 28b is arranged with a distance from each other on the surface of the base insulation layer 27. In the first embodiment, the pair of the electrodes 28a and 28b is arranged opposite to each other with a gap distance $\Delta G$ at a predetermined position on the base insulation layer 27.

As materials constituting the electrodes 28a and 28b, there can be mentioned at least one kind of metal or an alloy of metals selected from Ni, Cr, Al, Pd, Ti, Cu, Ag, Au, and Pt, for example. However, metals are not particularly limited thereto. In the first embodiment, while the electrodes 28a and 28b are formed in a rectangular shape as a planar view, the shape is not particularly limited thereto, and can be a comb-teeth shape or a saw-teeth shape.

The gap distance $\Delta G$ between the electrodes 28a and 28b can be suitably set by considering a desired discharge characteristic. Although not particularly limited, the gap distance $\Delta G$ is usually about 0.1 to 50 μm. From the viewpoint of securing low-voltage initial discharge, the gap distance AG is more preferably about 0.1 to 20 μm, and further preferably about 0.1 to 10 μm. A thickness of the electrodes 28a and 28b can be suitably set, and it is usually about 0.05 to 10 μm although not particularly limited thereto.

The ESD absorbing layer 30 is arranged between the electrodes 28a and 28b. In the first embodiment, the ESD absorbing layer 30 is laminated on the surface of the base insulation layer 27 and on the electrodes 28a and 28b. A size and a shape and a layout position of the ESD absorbing layer 30 are not particularly limited so long as the ESD absorbing layer 30 is designed to secure initial discharge between the electrodes 28a and 28b via the self when an excess voltage is applied.

The ESD absorbing layer 30 is a composite of a sea-island structure having an aggregate of a conductive inorganic material 33 dispersed discontinuously in a matrix of an insulation inorganic material 32. In the first embodiment, the ESD absorbing layer 30 is formed by sequentially performing sputtering. Specifically, the conductive inorganic material 33 is partially (incompletely) filmed by sputtering, on at least one of an insulation surface of the base insulation layer 27 and the electrodes 28a and 28b. Thereafter, the insulation inorganic material 32 is sputtered, thereby forming a composite of a laminating structure of a layer of the conductive inorganic material 33 dispersed in a so-called island shape and a layer of the insulation inorganic material 32 covering the layer of the conductive inorganic material 33.

As an example of the insulation inorganic material 32 constituting a Matrix, a metal oxide and a metal nitride can be mentioned, but the material is not limited thereto. Considering insulation and costs, $Al_2O_3$, $TiO_2$, $SiO_2$, ZnO, $In_2O_3$, NiO, CoO, $SnO_2$, $V_2O_5$, CuO, MgO, $ZrO_2$, AlN, BN, and SiC are preferable. Either one kind or two or more kinds of these materials can be used. Among these materials, from the viewpoint of giving high insulation to an insulation matrix, $Al_2O_3$ or $SiO_2$ is more preferably used. On the other hand, from the viewpoint of giving semiconductivity to the insulation matrix, $TiO_2$ or ZnO is more preferably used. When semiconductivity is given to the insulation matrix, ESD protection elements having excellent discharge starting voltage and clamp voltage can be obtained. While a method of giving semiconductivity to the insulation matrix is not particularly limited, $TiO_2$ or ZnO can be used as a single material, or these materials can be used together with other insulation inorganic material 32. Particularly, $TiO_2$ has oxygen easily lost at the time of sputtering in an argon atmosphere, and electric conductivity tends to become high. Therefore, it is particularly preferable to use $TiO_2$ to give semiconductivity to the insulation matrix. The insulation inorganic material 32 also functions as a protection layer that protects the pair of the electrodes 28a and 28b and the conductive inorganic material 33 from an optional layer (for example, the insulation layer 16a) positioned on an upper layer.

As an example of the conductive inorganic material 33, a metal, an alloy, a metal oxide, a metal nitride, a metal carbide, and a metal boride can be mentioned. However, the conductive inorganic material 33 is not limited to these materials. Considering conductivity, C, Ni, Cu, Au, Ti, Cr, Ag, Pd, and Pt, or an alloy of these materials are preferable.

A combination of Cu, $SiO_2$, and Au is particularly preferable for a combination of the electrode 28, the insulation inorganic material 32, and the conductive inorganic material 33 configuring the ESD absorbing layer 30. ESD protection elements constituted by these materials are not only excellent in an electric characteristic but also are extremely advantageous in workability and costs. Particularly, a composite of a sea-island structure having an aggregate of the conductive inorganic material 33 of an island shape dispersed discontinuously can be formed in high precision and easily.

A total thickness of the ESD absorbing layer 30 is not particularly limited and can be suitably set. From the viewpoint of achieving a thinner film, the total thickness is preferably 10 nm to 10 μm. More preferably, the total thickness is 15 nm to 1 μm, and further preferably, it is 15 to 500 nm. In forming a layer of the conductive inorganic material 33 of an island shape dispersed discontinuously and a layer of the matrix of the insulation inorganic material 32 like in the first embodiment, a thickness of the layer of the conductive inorganic material 33 is preferably 1 to 10 nm, and the thickness of the layer of the insulation inorganic material 32 is preferably 10 nm to 10 μm, more preferably 10 nm to 1 μm, and further preferably 10 to 500 nm.

A method of forming the ESD absorbing layer 30 is not limited to the sputtering method described above. The ESD absorbing layer 30 can be formed by giving the insulation inorganic material 32 and the conductive inorganic material 33 onto at least one of the insulation surface of the base insulation layer 27 and the electrodes 28a and 28b, by applying a known thin-film forming method.

In the ESD protection layer 12b of the first embodiment, the ESD absorbing layer 30 containing the island-shape conductive inorganic material 33 dispersed discontinuously in the matrix of the insulation inorganic material 32 functions as a low-voltage discharge type ESD protection material. By employing this configuration, it is possible to realize high-performance ESD protection elements having a small electrostatic capacitance, a low discharge starting voltage, and excellent discharge resistance. For the ESD absorbing layer 30 functioning as a low-voltage discharge type ESD protection material, a composite constituted by at least the insulation inorganic material 32 and the conductive inorganic material 33 is employed. Therefore, heat resistance is increased as compared with that of the conventional organic-inorganic composite film described above, and a characteristic does not easily vary due to external environments such as temperature and humidity. As a result, reliability is increased. The ESD absorbing layer 30 can be formed by a sputtering method. Accordingly, productivity and economics are more increased. The ESD protection elements in the first embodiment can be configured such that the ESD absorbing layer 30 contains an element configuring the electrodes 28a and 28b by partially dispersing the electrodes 28a and 28b in the ESD absorbing layer 30 by applying a voltage to between the electrodes 28a and 28b.

Figure 6:
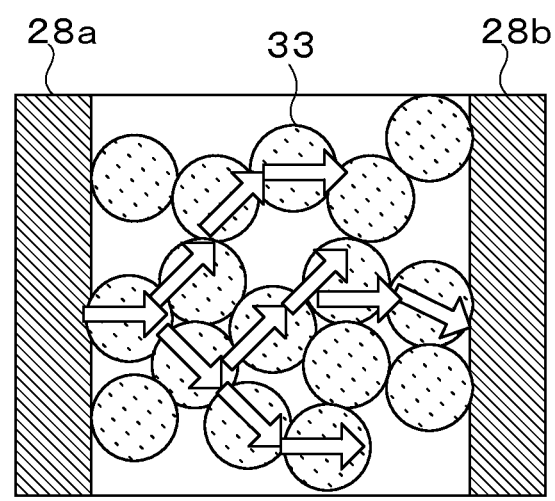
FIG. 6 is a schematic view for explaining a principle of the ESD protection elements.

FIG. 6 is a schematic view for explaining a principle of the ESD protection elements.

As shown in FIG. 6, when a discharge voltage based on ESD is applied to between a pair of the electrodes 28a and 28b, the discharge current flows from the electrode 28a toward the electrode 28b (ground) passing through an optional route constituted by the island-shape conductive inorganic material 33 discontinuously dispersed in the matrix of the insulation inorganic material 32 as shown by arrowheads. In this case, the conductive inorganic material 33 at a ground point having a large concentration of energy in the current route is destroyed together with the insulation inorganic material 32, and discharge energy of ESD is absorbed. Although a destroyed route becomes nonconductive, ESD can be absorbed at plural times because many current routes are formed by the island-shape conductive inorganic material 33 discontinuously dispersed, as shown in FIG. 6.

As explained above, the composite electronic device 100 according to the first embodiment includes low-voltage type ESD protection elements having a small electrostatic capacitance, a low discharge starting voltage, and excellent discharge resistance, heat resistance, and weatherability. Therefore, a composite electronic device functioning as a common mode filter including a high-performance ESD protection function can be realized.

According to the first embodiment, the insulation inorganic material 32 and the conductive inorganic material 33 are used as materials of the ESD protection layer 12b. Because a resin is not contained in various materials configuring the ESD protection layer 12b, the ESD protection layer 12b can be formed on the magnetic substrate 11a, and the common-mode filter layer 12a can be formed on the ESD protection layer 12b. To form the common-mode filter layer 12a by a so-called thin-film forming method, a heat processing step at 350° C. or above is necessary. To form the common-mode filter layer 12a by a so-called layer laminating method of sequentially laminating ceramic sheets formed with conductor patterns, a heat processing step at 800° C. is necessary. However, when the insulation inorganic material 32 and the conductive inorganic material 33 are used as materials of the ESD protection layer, the materials can bear the heat processing step, and ESD protection elements functioning normally can be formed. The ESD protection elements can be formed on a sufficiently flat surface on a magnetic substrate, and a fine gap of gap electrodes can be stably formed.

According to the first embodiment, formation positions of the gap electrodes are not overlapped on a plane surface with the first and second spiral conductors configuring the common mode filter, and the gap electrodes are provided at positions deviating from the conductor patterns. Therefore, influence to upper and lower directions can be suppressed when the ESD protection elements are partially destroyed by ESD, and a composite electronic device having higher reliability can be realized.

According to the first embodiment, as shown in FIG. 2, the composite electronic device 100 is mounted on the pair of signal lines, and the ESD protection elements 15a and 15b are provided nearer to the input side of the signal lines than to the common mode filter 14a. Therefore, absorption efficiency of an excess voltage of the ESD protection elements can be increased. Usually, an excess voltage of ESD is an abnormal voltage having no balance in impedance matching, and therefore, is once reflected at an input end of the common mode filter. This reflection signal is superimposed with an original signal waveform. A signal of an increased voltage is absorbed at once by the ESD protection elements. That is, a common mode filter at a latter stage of the ESD protection elements increases a size of the waveform to larger than that of the original waveform. Therefore, it is possible to generate a state that the signal can be more easily absorbed by the ESD protection elements than when the signal is absorbed in a state of a low voltage level. By inputting a once-absorbed signal into the common mode filter in this way, fine noise can be removed.

A method of manufacturing the composite electronic device 100 according to the first embodiment is explained in detail next.

Figure 7:
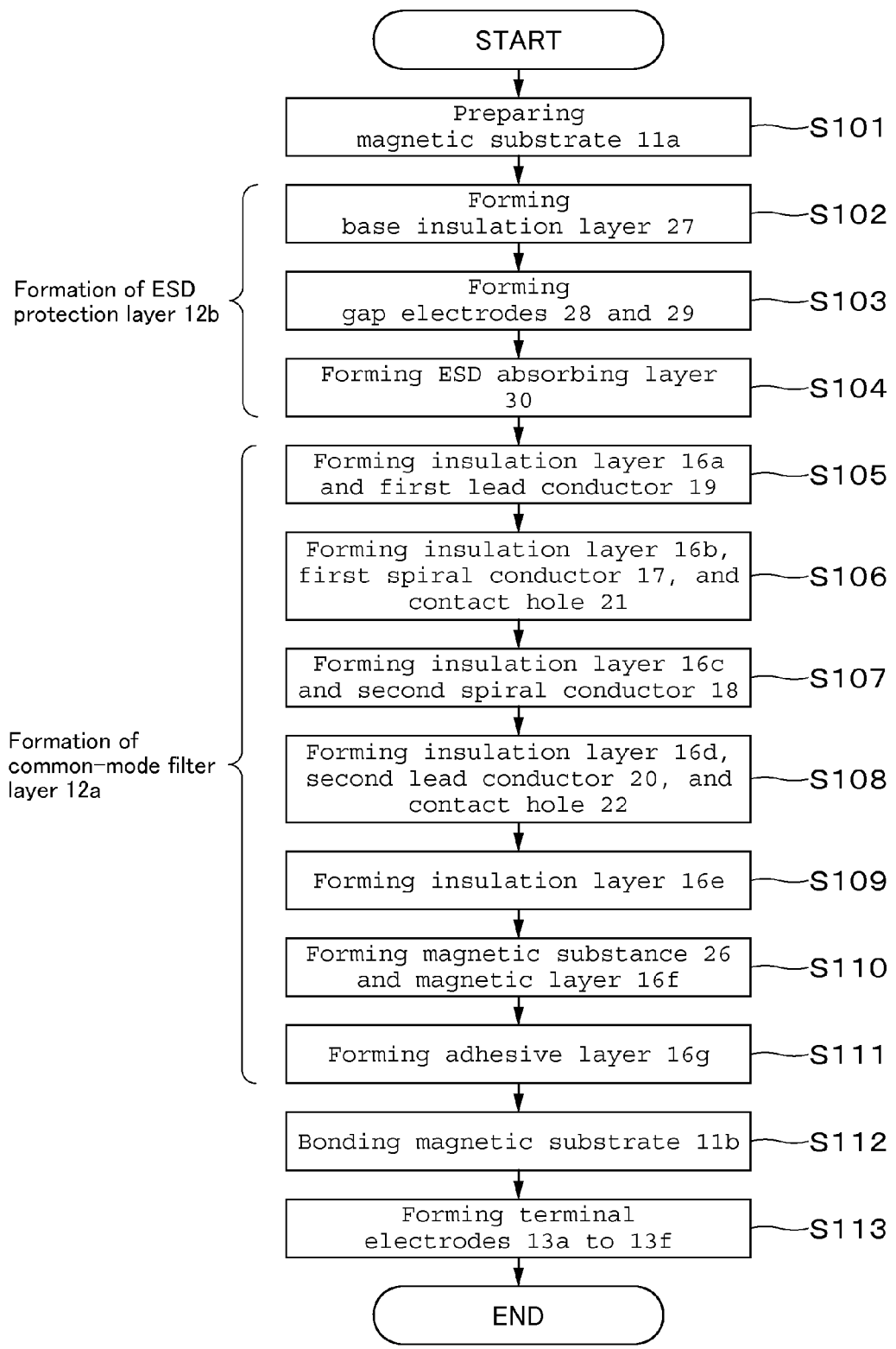
FIG. 7 is a flowchart showing a manufacturing step of the composite electronic device.

FIG. 7 is a flowchart showing a manufacturing step of the composite electronic device.

In the method of manufacturing the composite electronic device 100, the first magnetic substrate 11a is first prepared (Step S101), the ESD protection layer 12b is formed on the surface of the first magnetic substrate 11a (Steps S102 to S104), and the common-mode filter layer 12a is formed on the surface of the ESD protection layer 12b (Steps S105 to S111). The second magnetic substrate 11b is laminated (Step S112). Thereafter, the terminal electrodes 13a to 13f are formed on the external peripheral surface (Step S113), thereby completing the composite electronic device 100 having the common-mode filter layer 12a and the ESD protection layer 12b sandwiched between the first and second magnetic substrates 11a and 11b.

The method of manufacturing the composite electronic device 100 according to the first embodiment is used to consistently form the common-mode filter layer 12a and the ESD protection layer 12b by the thin-film forming method. The thin-film forming method is a method of forming a multilayer film having insulation layers and conductor layers alternately formed, by forming insulation layers by coating a photosensitive resin, exposing and developing this layer, and thereafter by repeating a step of forming conductor patterns on a surface of the insulation layers. A step of forming the ESD protection layer 12b and the common-mode filter layer 12a is explained in detail below.

In the formation of the ESD protection layer 12b, the base insulation layer 27 is first formed on the surface of the magnetic substrate 11a (Step S102). A method of forming the base insulation layer 27 is not particularly limited, and a known method can be applied such as a vacuum deposition method, a reactive deposition method, a sputtering method, an ion plating method, and a gas phase method such as CVD and PVD. A film thickness of the base insulation layer 27 can be suitably set.

The gap electrodes 28 and 29 are formed on the surface of the base insulation layer 27 (Step S103). The gap electrodes 28 and 29 can be formed by forming a film of an electrode material on the whole surface of the base insulation layer 27, and thereafter by patterning the electrode material. Because the gap distance ΔG between the pair of electrodes is very fine like about 0.1 to 50 μm, a high-precision patterning is required, and flatness of the base surface is also required. The base insulation layer 27 is formed on the magnetic substrate 11a having high flatness. Because the base insulation layer 27 has high flatness, a fine gap width can be controlled in high precision.

The ESD absorbing layer 30 is formed on the surface of the base insulation layer 27 on which the gap electrodes 28 and 29 are formed (Step S104). Specifically, the conductive inorganic material 33 is partially (incompletely) filmed by sputtering, on at least one of the insulation surface of the base insulation layer 27 and the electrodes 28a and 28b. Thereafter, the insulation inorganic material 32 is sputtered, thereby forming a composite of a laminating structure of a layer of the conductive inorganic material 33 dispersed in an island shape and a layer of the insulation inorganic material 32 covering the layer of the conductive inorganic material 33. As a result, the ESD protection layer 12b is completed.

In the formation of the common-mode filter layer 12a, insulation layers and conductor patterns are alternately formed, thereby forming the insulation layers 16a to 16e, the first and second spiral conductors 17 and 18, and the first and second lead conductors 19 and 20 (Steps S105 to S109). Specifically, after the insulation layer 16a is formed on the ESD protection layer 12b, the first lead conductor 19 is formed on the insulation layer 16a (Step S105). Next, after the insulation layer 16b is formed on the insulation layer 16a, the first spiral conductor 17 is formed on the insulation layer 16b, and a contact hole 21 piercing through the insulation layer 16b is formed (Step S106). After the insulation layer 16c is formed on the insulation layer 16b, the second spiral conductor 18 is formed on the insulation layer 16c (Step S107). Next, after the insulation layer 16d is formed on the insulation layer 16c, the second lead conductor 20 is formed on the insulation layer 16d, and the contact hole 22 piercing through the insulation layer 16d is formed (Step S108). Further, the insulation layer 16e is formed on the insulation layer 16d (Step S109).

The insulation layers 16a to 16e can be formed by spin coating a photosensitive resin on the base surface, and by exposing and developing the photosensitive resin. Particularly, the insulation layers 16b to 16e can be formed as insulation layers having the opening 25. Conductor patterns such as spiral conductors can be formed by forming a conductor layer by a deposition method or by a sputtering method, and thereafter by patterning the conductor layer.

The magnetic substance 26 is filled into the opening 25, and the magnetic layer 16f is formed on the surface of the insulation layer 16e as well (Step S110). Thereafter, the adhesive layer 16g is formed (Step S111), and the second magnetic substrate 11b is bonded via the adhesive layer 16g (Step S112). The terminal electrodes 13a to 13f are formed on an external peripheral surface of a laminated body (Step S113), thereby completing the composite electronic device 100.

As explained above, the method of manufacturing a composite electronic device according to the first embodiment is a thin-film forming method for consistently forming the ESD protection layer 12b and the common-mode filter layer 12a. Therefore, the composite electronic device can be manufactured without via a special manufacturing step. The method of manufacturing a composite electronic device according to the first embodiment is for forming the ESD protection layer 12b on the magnetic substrate 11a, and forming the common-mode filter layer 12a on the ESD protection layer 12b. Therefore, the ESD protection elements can be formed on the surface of the magnetic substrate 11a having a relatively flat surface, and a composite electronic device having combined high-quality ESD protection elements and a common-mode filter can be manufactured.

Another example of the ESD protection layer 12b is explained next.

Figure 8A:
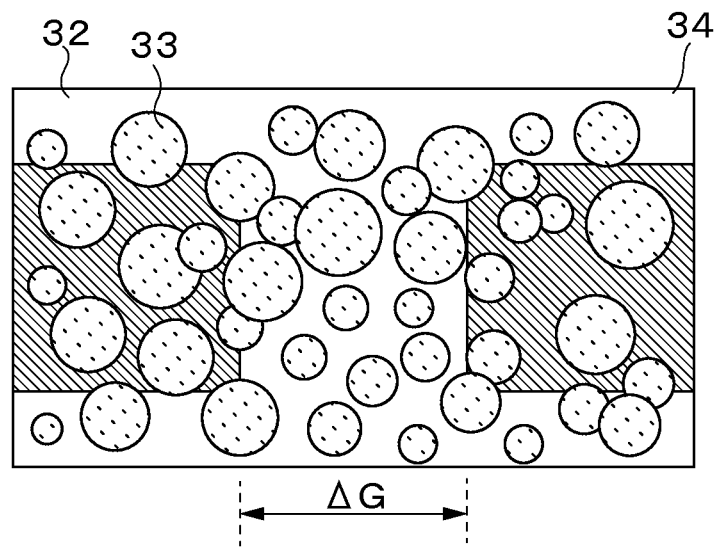
FIG. 8A is a schematic plan view showing other example of a layer structure near the first gap electrode 28 in the ESD protection layer 12b.
Figure 8B:
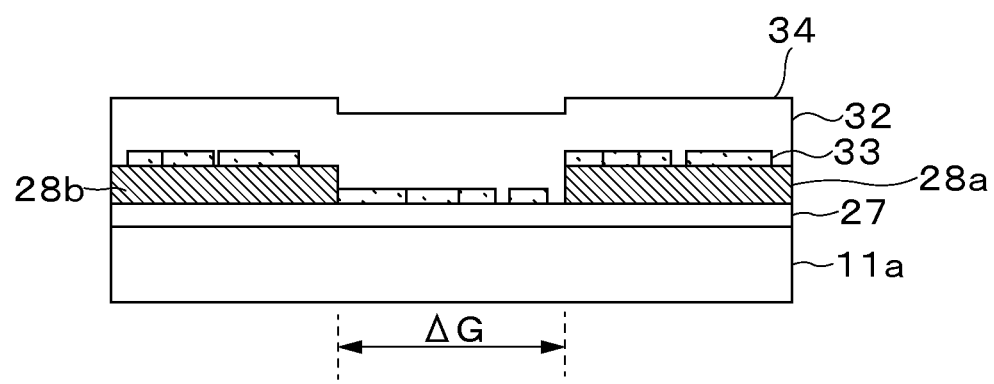
FIG. 8B is a schematic cross-sectional view showing other example of a layer structure near the first gap electrode 28 in the ESD protection layer 12b.

FIGS. 8A and 8B are other examples of a layer structure near the first gap electrode 28 in the ESD protection layer 12b, where FIG. 8A is a schematic plan view and FIG. 8B is a schematic cross-sectional view.

As shown in FIGS. 8A and 8B, the ESD protection layer 12b has the same configuration as that of the ESD protection layer according to the first embodiment, except that the ESD protection layer 12b has an ESD absorbing layer 34 in place of the ESD absorbing layer 30.

The ESD absorbing layer 34 is a composite having the conductive inorganic material 33 discontinuously dispersed in a matrix of the insulation inorganic material 32. In the first embodiment, the ESD absorbing layer 34 is formed by sputtering (or by simultaneous sputtering) using a target containing the insulation inorganic material 32 (or a target containing the insulation inorganic material 32 and the conductive inorganic material 33) on at least one of the insulation surface of the base insulation layer 27 and the electrodes 28a and 28b, and thereafter, by partially dispersing the electrodes 28a and 28b at random in the insulation inorganic material 32 by applying a voltage to between the electrodes 28a and 28b. Therefore, the ESD absorbing layer 34 in the first embodiment contains an element configuring at least the electrodes 28a and 28b as the conductive inorganic material 33.

A total thickness of the ESD absorbing layer 34 is not particularly limited, and can be suitably set. From the viewpoint of achieving a thinner film, the total thickness is preferably 10 nm to 10 μm. More preferably, the total thickness is 10 nm to 1 μm, and further preferably, it is 10 to 500 nm.

In the ESD protection layer 12b of the first embodiment, as the ESD absorbing layer 34 functioning as a low-voltage discharge type ESD protection material, there is employed a composite having the conductive inorganic material 33 of a particle shape discontinuously dispersed in the matrix of the insulation inorganic material 32. Operational effect identical to that of the first embodiment can be obtained from this configuration.

Figure 9:
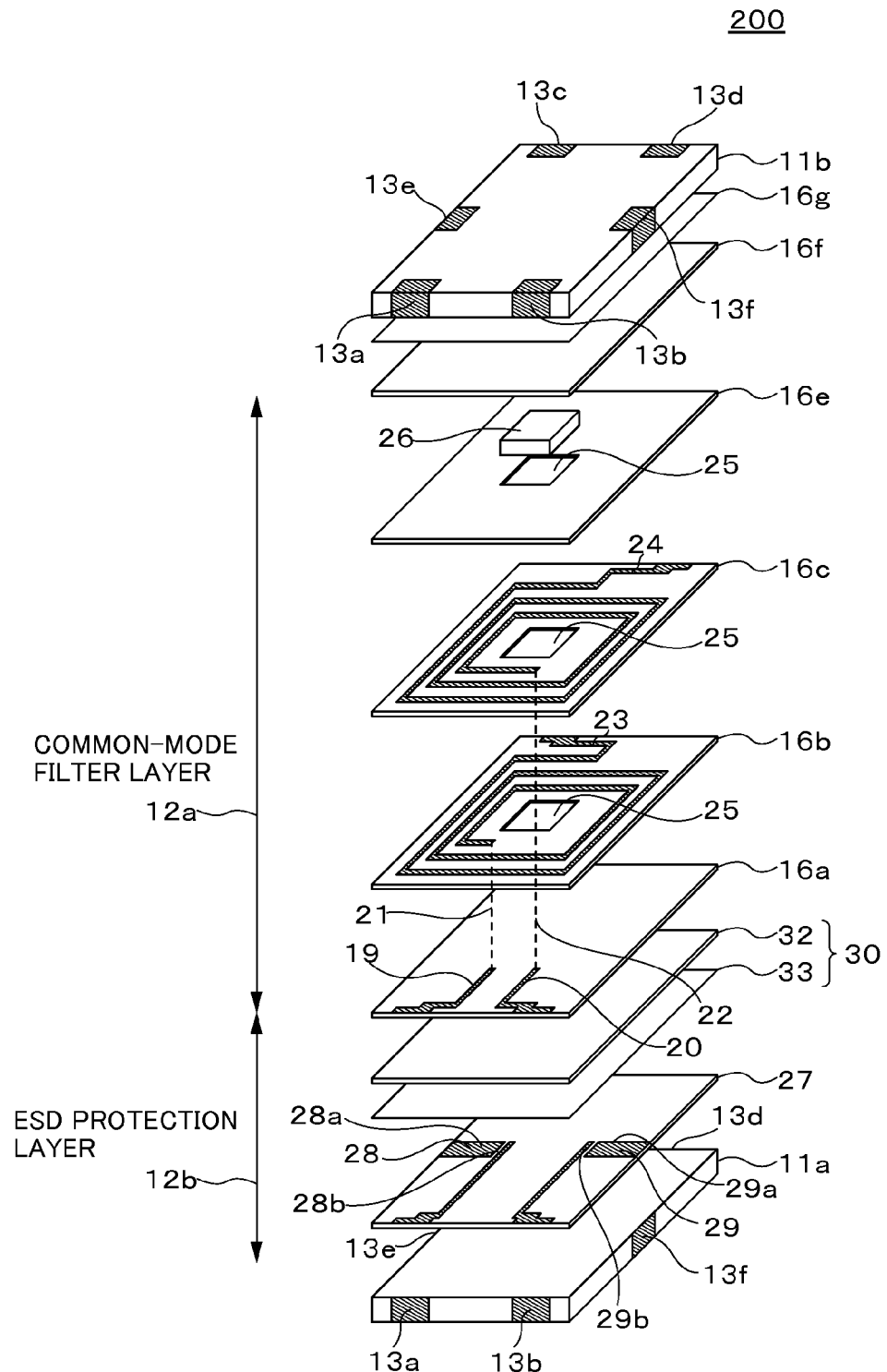
FIG. 9 is a schematic perspective view showing a layer structure of a composite electronic device 200 according to a second embodiment of the present invention.

FIG. 9 is a schematic perspective view showing a layer structure of a composite electronic device 200 according to a second embodiment of the present invention.

As shown in FIG. 9, in the composite electronic device 200, the first and second lead conductors 19 and 20 of the common-mode filter layer 12a are formed on the common insulation layer 16a. Therefore, the insulation layer formed with the second lead conductor 20 in the first embodiment is omitted, and one insulation layer becomes unnecessary. Consequently, a layer thickness of the common-mode filter layer 12a can be reduced, and the composite electronic device 200 can have a small height, and a manufacturing step thereof can be simplified.

Figure 10:
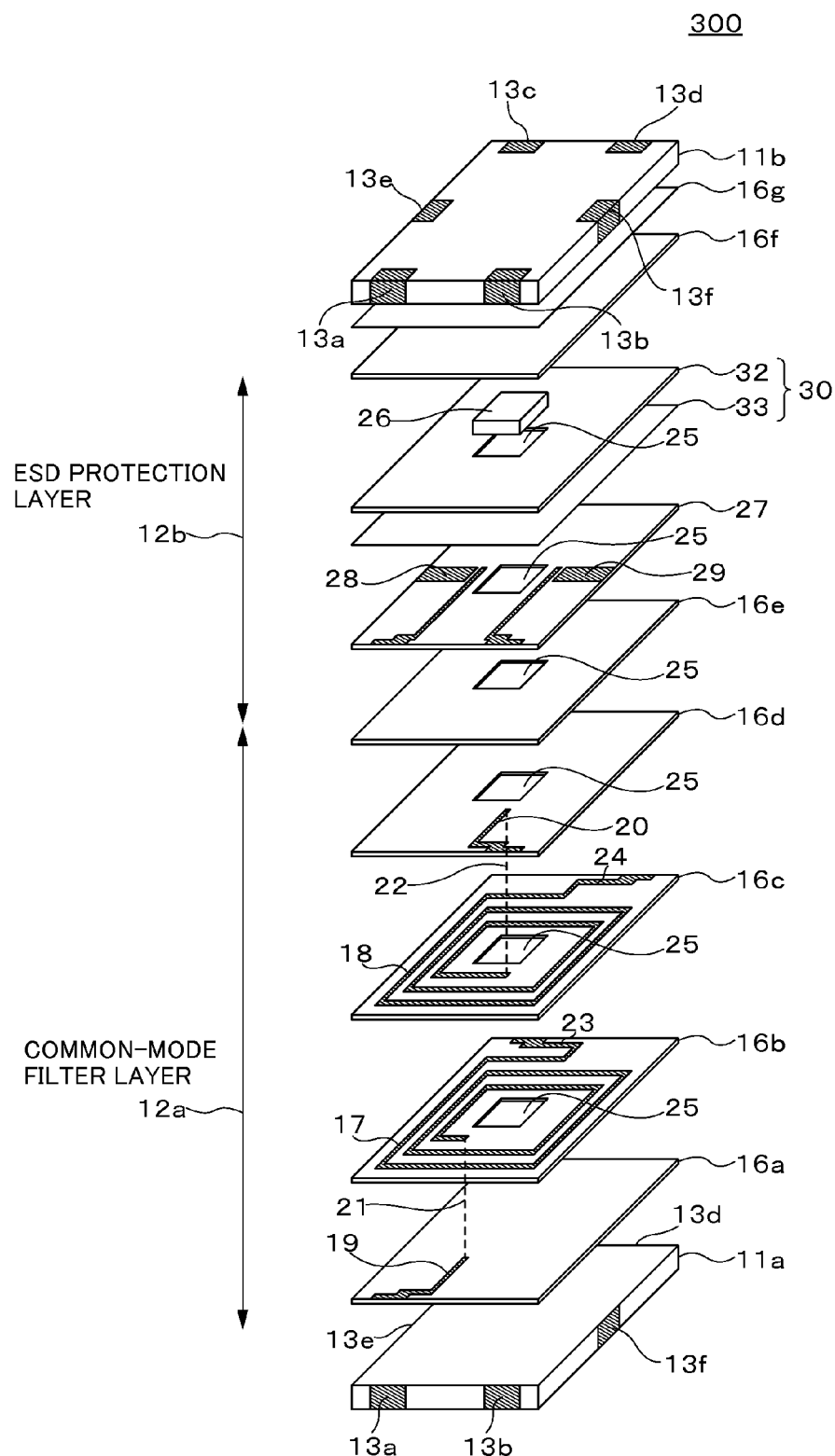
FIG. 10 is a schematic perspective view showing a layer structure of a composite electronic device 300 according to a third embodiment of the present invention.

FIG. 10 is a schematic perspective view showing a layer structure of a composite electronic device 300 according to a third embodiment of the present invention.

As shown in FIG. 10, in the composite electronic device 300, the common-mode filter layer 12a is provided on a lower layer, and the ESD protection layer 12b is provided on an upper layer. Because there is no change in the configuration of the common-mode filter layer 12a and in the configuration of the ESD protection layer 12b, like constituent elements are denoted by like reference characters, and redundant explanations thereof will be omitted. According to the third embodiment, the composite electronic device 300 includes low-voltage type ESD protection elements having a small electrostatic capacitance, a low discharge starting voltage, and excellent discharge resistance, heat resistance, and weatherability, in a similar manner to that of the first embodiment. Therefore, a composite electronic device functioning as a common mode filter including a high-performance ESD protection function can be realized. Because the ESD protection layer 12b is provided on the upper surface of the common-mode filter layer 12a, the upper surface of the common-mode filter layer 12a becoming a base surface needs to have sufficient flatness.

Figure 11:
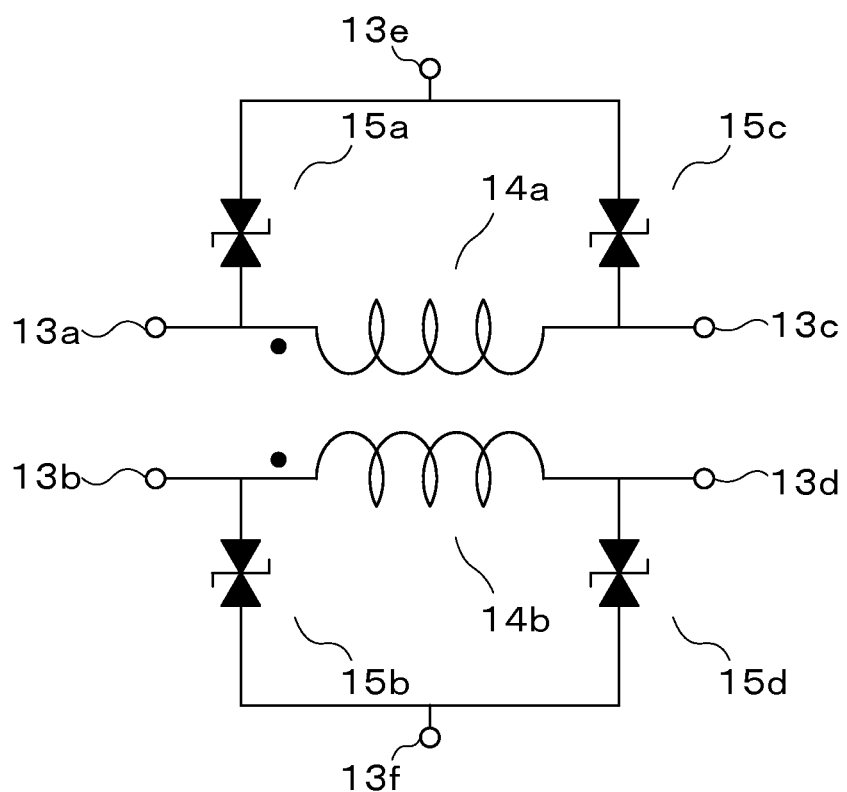
FIG. 11 is a circuit diagram showing a configuration of a composite electronic device 400 according to a fourth embodiment of the present invention.

FIG. 11 is a circuit diagram showing a configuration of a composite electronic device 400 according to a fourth embodiment of the present invention.

As shown in FIG. 11, the composite electronic device 400 includes the inductor elements 14a and 14b functioning as a common-mode choke coil, and the ESD protection elements 15a to 15d. One ends of the inductor elements 14a and 14b are connected to the first and second terminal electrodes 13a and 13b, respectively, and the other ends of the inductor elements 14a and 14b are connected to the third and fourth terminal electrodes 13c and 13d, respectively. One ends of the ESD protection elements 15a and 15b are connected to the first and second terminal electrodes 13a and 13b, respectively, and the other ends of the ESD protection elements 15a and 15b are connected to the fifth and sixth terminal electrodes 13e and 13f, respectively. Further, one ends of the ESD protection elements 15c and 15d are connected to the third and fourth terminal electrodes 13c and 13d, respectively, and the other ends of the ESD protection elements 15c and 15d are connected to the fifth and sixth terminal electrodes 13e and 13f, respectively. As shown in FIG. 13, the composite electronic device 400 is mounted on a pair of signal lines. In the fourth embodiment, a pair of ESD protection elements is provided at both the input side and the output side as a symmetrical circuit, unlike in the first embodiment. Therefore, a circuit configuration becomes the same even when the first and second terminal electrodes 13a and 13b are connected to the input side or to the output side of the signal lines.

Figure 12:
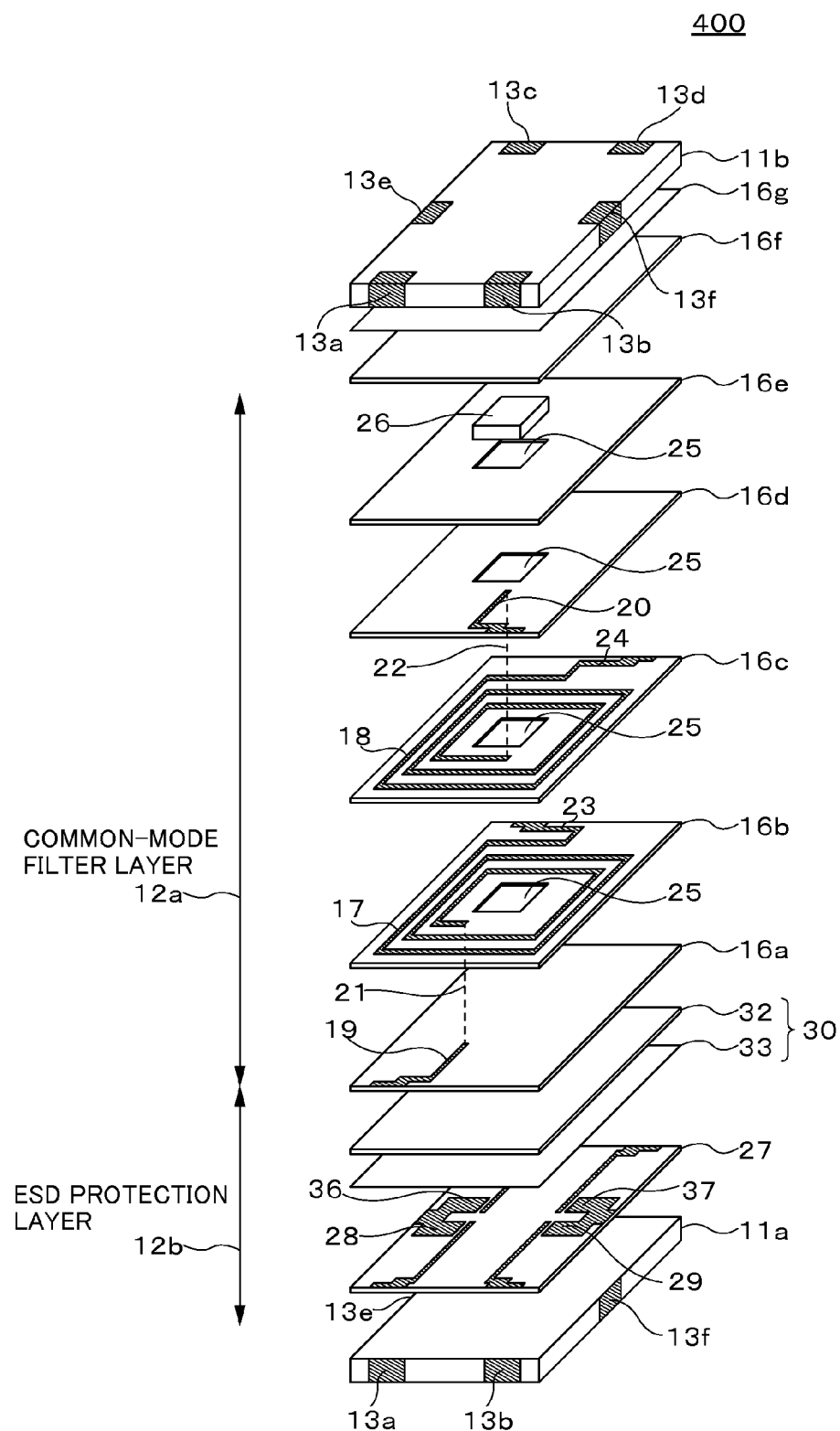
FIG. 12 is a schematic exploded perspective view showing one example of a layer structure of the composite electronic device 400.

FIG. 12 is a schematic exploded perspective view showing one example of a layer structure of the composite electronic device 400.

As shown in FIG. 12, in the composite electronic device 400, a shape of gap electrodes formed on the surface of the base insulation layer 27 within the ESD protection layer 12b has a characteristic. The composite electronic device 400 includes not only the first and second gap electrodes 28 and 29 but also third and fourth gap electrodes 36 and 37. A layer structure near the first gap electrode 28 is a portion functioning as the first ESD protection element 15a shown in FIG. 11, and a layer structure near the second gap electrode 29 is a portion functioning as the second ESD protection element 15b. A layer structure near the third gap electrode 36 is a portion functioning as the third ESD protection element 15c, and a layer structure near the fourth gap electrode 37 is a portion functioning as the fourth ESD protection element 15d. One end of the first gap electrode 28 is connected to the first terminal electrode 13a, and the other end of the first gap electrode 28 is connected to the fifth terminal electrode 13e. One end of the second gap electrode 29 is connected to the second terminal electrode 13b, and the other end of the second gap electrode 29 is connected to the sixth terminal electrode 13f. One end of the third gap electrode 36 is connected to the third terminal electrode 13c, and the other end of the third gap electrode 36 is connected to the fifth terminal electrode 13e. One end of the fourth gap electrode 37 is connected to the fourth terminal electrode 13d, and the other end of the fourth gap electrode 37 is connected to the sixth terminal electrode 13f.

As explained above, the composite electronic device 400 according to the fourth embodiment is a symmetrical circuit having a pair of ESD protection elements provided at both the input side and the output side. Therefore, the composite electronic device 400 can be provided as a chip device having no constraint in a mounting direction.

While preferred embodiments of the present invention have been explained above, the present invention is not limited thereto. Various modifications can be made to the embodiments without departing from the scope of the present invention and it is needless to say that such modifications are also embraced within the scope of the invention.

For example, in the above embodiments, while the ESD protection layer 12b is provided on a lower layer and the common-mode filter layer 12a is provided on an upper layer, the ESD protection layer 12b can be provided on an upper layer and the common-mode filter layer 12a can be provided on a lower layer. In this case, the ESD protection layer 12b is formed on the upper surface of the common-mode filter layer 12a. Therefore, the upper surface of the common-mode filter layer needs to have sufficient flatness.

In the above embodiments, while an approximately rectangular spiral conductor (an angle pattern formed by straight lines) is used, an approximately circular spiral conductor (a round pattern formed by a curve) can be used. When a round pattern is used, gap electrodes can be easily formed in an open region where any pattern is not formed.

What is claimed is:

1. A composite electronic device comprising an inductor element and an ESD protection element formed between two magnetic substrates, wherein the inductor element includes insulation layers made of a resin, and conductor patterns formed on the insulation layers, the ESD protection element includes a base insulation layer, a pair of electrodes arranged via gap formed therebetween on the base insulation layer, and an ESD absorbing layer arranged at least between the electrodes, and the ESD absorbing layer includes a composite material having an insulation inorganic material and a conductive inorganic material discontinuously dispersed in a matrix of the insulation inorganic material.

2. The composite electronic device as claimed in claim 1, wherein the inductor element includes first and second spiral conductors formed on a plane surface perpendicular to a layer-laminating direction, and the first and second spiral conductors constitute a common mode filter and are magnetically coupled with each other.

3. The composite electronic device as claimed in claim 1, wherein an electrostatic capacitance of the ESD protection element has a value equal to or lower than 0.35 pF.

4. The composite electronic device as claimed in claim 1, wherein the resin is one of the polyimide resin and an epoxy resin, and the insulation inorganic material is at least one kind selected from a group of $Al_2O_3$, $TiO_2$, $SiO_2$, ZnO, $In_2O_3$, NiO, CoO, $SnO_2$, $V_2O_5$, CuO, MgO, $ZrO_2$, AlN, BN, and SiC.

5. The composite electronic device as claimed in claim 1, wherein the conductive inorganic material is at least one kind of metal or a metal compound of these metals selected from a group of C, Ni, Cu, Au, Ti, Cr, Ag, Pd, and Pt.

6. The composite electronic device as claimed in claim 1, wherein the pair of electrodes is formed on a surface of one of the magnetic substrates via the base insulation layer.

7. The composite electronic device as claimed in claim 6, wherein the inductor element includes first and second spiral conductors formed on a plane surface perpendicular to a layer-laminating direction, the first and second spiral conductors constitute a common mode filter and are magnetically coupled with each other, and the gap provided between the pair of electrodes are arranged not to be overlapped with conductor patterns of the inductor element viewed from the layer-laminating direction.

8. The composite electronic device as claimed in claim 1, wherein the gap provided between the pair of electrodes are arranged not to be overlapped with conductor patterns of the inductor element viewed from the layer-laminating direction.

9. The composite electronic device as claimed in claim 8, wherein the inductor element includes first and second spiral conductors formed on a plane surface perpendicular to a layer-laminating direction, the first and second spiral conductors constitute a common mode filter and are magnetically coupled with each other.

10. The composite electronic device as claimed in claim 8, wherein the pair of electrodes are formed on a surface of one of the magnetic substrates via the base insulation layer.

11. A composite electronic device comprising a common-mode filter layer and an ESD protection layer provided between two magnetic substrates, wherein the common-mode filter layer includes first and second insulation layers made of a resin, a first spiral conductor formed on the first insulation layer, and a second spiral conductor formed on the second insulation layer, the ESD protection layer includes a first ESD protection element connected to one end of the first spiral conductor, and a second ESD protection element connected to one end of the second spiral conductor, the first and second spiral conductors are formed in a plane-surface direction perpendicular to a layer-laminating direction, and are arranged to be magnetically coupled to each other, each of the first and second ESD protection elements includes a pair of electrodes arranged via gap formed therebetween on a base insulation layer, and ESD absorbing layer arranged at least between the electrodes, and the ESD absorbing layer includes a composite material having an insulation inorganic material and a conductive inorganic material discontinuously dispersed in a matrix of the insulation inorganic material.

12. The composite electronic device as claimed in claim 11, further including a third ESD protection element connected to the other end of the first spiral conductor, and a fourth ESD protection element connected to the other end of the second spiral conductor, wherein the third and fourth ESD protection elements have the same configurations as those of the first and second ESD protection elements.

13. The composite electronic device as claimed in claim 11, wherein the pair of the electrodes is formed on one of the magnetic substrates via the base insulation layer.

14. The composite electronic device as claimed in claim 11, wherein the gaps provided between the pair of electrodes are arranged not to be overlapped with the first and second spiral conductors of the common-mode filter layer viewed from the layer-laminating direction.

15. The composite electronic device as claimed in claim 12, wherein the pair of electrodes is formed on one of the magnetic substrates via the base insulation layer.

16. A connection structure of a pair of signal lines and a composite electronic device, wherein the composite electronic device includes an inductor element and an ESD protection element formed between two magnetic substrates, the inductor element includes insulation layers made of a resin, and conductor patterns formed on the insulation layers, the ESD protection element includes a base insulation layer, a pair of electrodes arranged via gap formed therebetween on the base insulation layer, and an ESD absorbing layer arranged at least between the electrodes, the ESD absorbing layer includes a composite material having an insulation inorganic material and a conductive inorganic material discontinuously dispersed in a matrix of the insulation inorganic material, the conductor patterns include first and second spiral conductors formed on a plane surface perpendicular to a layer-laminating direction, the first and second spiral conductors constitute a common mode filter and are magnetically coupled with each other, and one end of the first spiral conductor and one end of the second spiral conductor are connected to an input side of the pair of signal lines.

17. A connection structure of a pair of signal lines and a composite electronic device, wherein the composite electronic device comprises a common-mode filter layer and an ESD protection layer provided between two magnetic substrates, the common-mode filter layer includes first and second insulation layers made of a resin, a first spiral conductor formed on the first insulation layer, and a second spiral conductor formed on the second insulation layer, the ESD protection layer includes a first ESD protection element connected to one end of the first spiral conductor, and a second ESD protection element connected to one end of the second spiral conductor, the first and second spiral conductors are formed in a plane-surface direction perpendicular to a laminating direction, and are arranged to be magnetically coupled to each other, each of the first and second ESD protection elements includes a pair of electrodes arranged via gap formed therebetween on a base insulation layer, and ESD absorbing layer arranged at least between the electrodes, the ESD absorbing layer includes a composite material having an insulation inorganic material and a conductive inorganic material discontinuously dispersed in a matrix of the insulation inorganic material, and the one end of the first spiral conductor and the one end of the second spiral conductor are connected to an input side of the pair of signal lines.

18. A method of manufacturing a composite electronic device, comprising:

forming an ESD protection layer on a surface of a first magnetic substrate;

forming a common-mode filter layer on a surface of the ESD protection layer; and forming a second magnetic substrate on a surface of the common-mode filter layer, wherein forming the ESD protection layer includes forming a base insulation layer on a surface of the first magnetic substrate, forming a pair of electrodes arranged via gap formed therebetween on a surface of the base insulation layer, and forming an ESD absorbing layer arranged at least between the electrodes, and the ESD absorbing layer includes a composite material having an insulation inorganic material and a conductive inorganic material discontinuously dispersed in a matrix of the insulation inorganic material.

19. The method of manufacturing a composite electronic device as claimed in claim 18, wherein forming the common-mode filter layer includes alternately forming insulation layers made of a resin and conductor patterns, and the insulation layers, the conductor patterns, the base insulation layer, and the electrodes are formed by a thin-film forming method.

* * * * *